(12) United States Patent
Fukasawa et al.

(10) Patent No.: US 8,053,877 B2
(45) Date of Patent: Nov. 8, 2011

(54) SEMICONDUCTOR PACKAGE

(75) Inventors: Ryo Fukasawa, Kanagawa (JP);
Tatsuhiro Sawada, Niigata (JP)

(73) Assignee: Panasonic Corporation, Osaka (JP)

( * ) Notice: Subject to any disclaimer, the term of this patent is extended or adjusted under 35 U.S.C. 154(b) by 77 days.

(21) Appl. No.: 12/612,225

(22) Filed: Nov. 4, 2009

(65) Prior Publication Data

US 2010/0176467 A1 Jul. 15, 2010

(30) Foreign Application Priority Data

Jan. 9, 2009 (JP) .................. 2009-003367

(51) Int. Cl.
*H01L 23/02* (2006.01)
(52) U.S. Cl. . 257/678; 257/416; 257/680; 257/E33.058; 257/E23.104; 257/E21.299
(58) Field of Classification Search .................. 257/416, 257/678, 680, E33.058, E23.104, E21.499
See application file for complete search history.

(56) References Cited

U.S. PATENT DOCUMENTS

| | | | |
|---|---|---|---|
| 6,043,556 A | 3/2000 | Tomie | |
| 6,303,986 B1 | 10/2001 | Shook | |
| 6,376,907 B1 | 4/2002 | Takano et al. | |
| 2008/0211073 A1* | 9/2008 | Hatakeyama | 257/678 |

FOREIGN PATENT DOCUMENTS

| | | |
|---|---|---|
| JP | 2000-231945 | 8/2000 |
| JP | 2001-257456 | 9/2001 |
| JP | 2005-167507 | 6/2005 |
| JP | 2007-201356 | 8/2007 |

* cited by examiner

*Primary Examiner* — Long Tran
(74) *Attorney, Agent, or Firm* — McDermott Will & Emery LLP

(57) ABSTRACT

A semiconductor package includes a chip base material; a capacitor formed on the base material; and a cover formed over the base material to cover the capacitor, and having a side portion and an upper portion. The base material is provided with a bonding pattern connecting the base material and the cover to cover the capacitor. The bonding pattern includes a region A having a substantially uniform pattern width A, and at least one region B having a pattern width B which is larger than the width pattern width A.

18 Claims, 10 Drawing Sheets

SEMICONDUCTOR PACKAGE

CROSS-REFERENCE TO RELATED APPLICATION

This application claims priority to Japanese Patent Application No. 2009-3367 filed on Jan. 9, 2009, the disclosure of which including the specification, the drawings, and the claims is hereby incorporated by reference in its entirety.

BACKGROUND

The present disclosure relates to semiconductor packages mountable on substrates of electronic devices.

As a conventional method of mounting a shield cover, a technique described in Japanese Published Patent Application 2007-201356 (hereinafter referred to as Patent Document 1) is known. The technique in Patent Document 1 will hereinafter be described with reference to FIGS. 16A and 16B.

FIGS. 16A and 16B show that a copper foil pattern 2 is formed on an electronic device substrate 1, and that a shield cover 3 is bonded onto the copper foil pattern 2. The copper foil pattern 2 includes a narrow width portion 4. The function of the narrow width portion 4 is to correct displacement of the cover using surface tension of solder cream which bonds the shield cover 3 to the electronic device substrate 1. In the technique of Patent Document 1, the cover is mounted on part of a plurality of components on the electronic device substrate 1.

SUMMARY

However, in the technique of mounting a shield cover described in Patent Document 1, the width of the copper foil pattern is regionally reduced. Thus, when a shield cover is bonded in a minimized package, the bonding area of the region, in which the width of the copper foil pattern is reduced, further decreases. The present inventors found the problem that bond strength decreases in the minimized bonding area.

In order to solve the above-described problem, a mountable semiconductor package according to the present invention includes a base material; a capacitor formed on the base material; and a cover formed over the base material to cover the capacitor, and having a side portion and an upper portion. The base material is provided with a bonding pattern connecting the base material and the cover to cover the capacitor. The bonding pattern includes a region A having a substantially uniform pattern width A, and at least one region B having a pattern width B which is larger than the width pattern width A.

The mountable semiconductor package according to the present invention includes a region having an expanded pattern width. Thus, a sufficient bonding area of the pattern and the cover can be obtained when bonding the cover to a pattern on the base material to increase bond strength.

In the mountable semiconductor package according to the present invention, the bonding pattern is preferably made of metal. The bonding pattern is preferably formed (defined) by a resist pattern formed on the base material and having a recess. The cover and the base material are preferably bonded to each other with a conductive bonding material. The bonding material is made of solder metal, an adhesive, and the like.

In the mountable semiconductor package according to the present invention, when applying the bonding material made of metal to the bonding pattern, the bonding material needs to be applied so that the starting point and the ending point of bonding overlap each other, to increase sealing performance between the cover and the base material. At this time, a region having an expanded pattern width is formed in advance to reliably retain an excess bonding material within the region B. This prevents a contact of the excess bonding material with other metal patterns such as a metal pattern for mounting a capacitor. This can reliably avoid the risk of an electrical short.

In the mountable semiconductor package according to the present invention, the region B preferably occupies from about 10% to 30% of the bonding pattern to reduce cost effectively.

In the mountable semiconductor package according to the present invention, a part of the region B is preferably formed inside the side portion of the cover. In this structure, even when force causing displacement of the cover is applied, a part of the region B, which is the portion projecting from the region A, can interfere with the cover's operation to move inward. That is, a self-alignment effect is improved.

In the mountable semiconductor package according to the present invention, a part of the region A is formed inside the side portion of the cover. A part of the region B is formed inside the side portion of the cover and is preferably formed inner than the part of the region A. This structure further increases the resistance to the cover's operation to move inward, even when force causing displacement of the cover is applied. That is, the self-alignment effect is further improved.

In the mountable semiconductor package according to the present invention, multiple ones of the at least one region B are preferably formed in two portions. By forming the regions B in two portions, the above-described effects are further increased. Furthermore, if the effect of a positioning correction obtained when thermally curing the bonding material is reduced, a self-alignment effect occurring in a reflow process can be obtained more sufficiently by providing a plurality of expanded portions. When the regions B are positioned almost symmetrically, a self-alignment effect occurring in a reflow process can be obtained more sufficiently. The regions B formed in two portions are preferably positioned symmetrically with respect to the perpendicular bisector of each side of the base material. The regions B formed in two portions are preferably positioned line-symmetrically with respect to the base material. That is, the regions B formed in two portions are preferably positioned point-symmetrically with respect to the base material. That is, the regions B formed in two portions are preferably positioned symmetrically. This provides a self-alignment effect occurring in a reflow process more effectively.

In the mountable semiconductor package according to the present invention, the pattern width B is preferably from about 1.2 to 2 times as large as the width a of the region A. This improves layout efficiency.

In the mountable semiconductor package according to the present invention, the capacitor is preferably a semiconductor device, and more preferably a MEMS device. The MEMS device here refers to various sensors such as a microphone (MEMS microphone), a pressure sensor, an acceleration sensor and an angular velocity sensor, which are formed by a semiconductor process technology.

In the mountable semiconductor package according to the present invention, a through-hole is preferably formed in either one of the base material and the cover. Where the capacitor detects a sound wave from the through-hole, the semiconductor package functions as a microphone. Where the capacitor detects pressure from the through-hole, the semiconductor package functions as a pressure sensor. In these cases, the through-hole functions as an introduction hole of the pressure or the sound wave. Furthermore, where the capacitor detects acceleration rate or angular velocity, the semiconductor package functions as an acceleration sensor or an angular velocity sensor, respectively. In this case, the through-hole functions as a passage of air in the semiconductor package.

In the mountable semiconductor package according to the present invention, a surface of the cover, which is in contact with the bonding pattern on the base material, is preferably formed to be parallel to a surface of the bonding pattern, which is in contact with the cover.

In the mountable semiconductor package according to the present invention, the side portion of the cover preferably bends toward the outside of the base material, near the bonding portion of the base material and the cover. This structure increases the bonding area of the base material and the cover with respect to the portion bending outward to increase bond strength of the cover.

In the mountable semiconductor package according to the present invention, the side portion of the cover is constituted by a portion C which is near the bonding portion of the base material and the cover, and a portion D other than the portion C. The portion C preferably has a smaller width than the portion D. This structure allows the cover to bond to the bonding pattern, even when the pattern is narrowed.

In the mountable semiconductor package according to the present invention, the side portion of the cover is constituted by a portion E which is near the bonding portion of the base material and the cover, and a portion F other than the portion E. It is preferable that a width of the portion E decreases gradually toward the bonding portion compared to the portion F. This structure enables a design in which bond strength of the cover and bonding of the cover to a narrow pattern are possible.

The mountable semiconductor package according to the present invention is preferably a semiconductor package mountable on an electronic device substrate such as a mobile phone.

It is apparent that the features described herein may be combined as appropriate, as long as there is consistency. In each feature, in which a plurality of advantages are expected, not all of the advantages need to be provided.

As described above, according to the present invention, the bonding pattern of the base material and the cover, which is provided on the base material, has an expanded portion in which the pattern width is expanded. Thus, when the cover is bonded to the pattern on the base material, a sufficient bonding area of the pattern and the cover is obtained to increase bond strength.

When the bonding material made of metal is applied to the bonding pattern to overlap, an excess bonding material is reliably retained within the expanded portion.

DETAILED DESCRIPTION

First Example Embodiment

A first example embodiment will hereinafter be described in detail with reference to FIGS. 1-6B. The materials and numerical values used in the present disclosure are merely preferable examples, and the scope of the present invention is not limited to this embodiment. The present embodiment can be practiced with modification and alteration within the spirit and scope of the present disclosure. In addition, the present embodiment can be implemented in combination with any other embodiment. In this embodiment, a capacitor is a MEMS device. The MEMS device is, as described below, a capacitor formed by a semiconductor process. As an example of the MEMS device, a microphone (MEMS microphone), a pressure sensor, an acceleration sensor, or an angular velocity sensor is provided. What is described above is applicable throughout the present disclosure.

Figure 1:
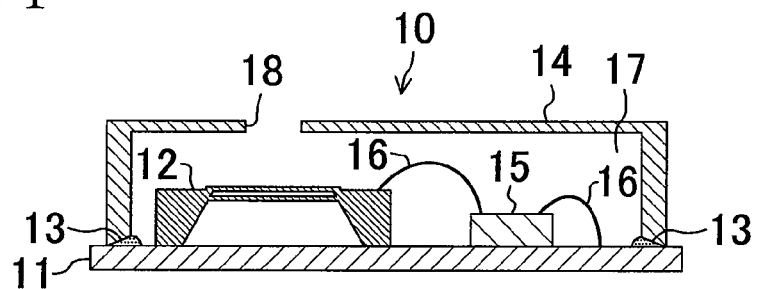
FIG. 1 is a cross-sectional view of a MEMS device according to a first example embodiment configured as a semiconductor package to be mounted on an electronic device such as a mobile phone.

FIG. 1 is a cross-sectional view of a MEMS device according to the first example embodiment configured as a semiconductor package to be mounted on an electronic device such as a mobile phone. As shown in FIG. 1, a circuit 15 including a MEMS device 12 and a CMOS is mounted on a first surface of a base material 11. Over the base material 11, a cover 14 is formed to cover the MEMS device 12 and the circuit 15. The circuit 15 is electrically coupled to the MEMS device 12 and the base material 11 by bonding wires 16. The base material 11 and the cover 14 are bonded to each other with a bonding material 13. As a result, space 17 is formed, which is surrounded by the base material 11, the cover 14, and the MEMS device 12. In this manner, a mountable semiconductor package 10 is formed. Furthermore, a through-hole (introduction hole) 18 for transmitting pressure or sound pressure to the MEMS device 12 is formed in the cover 14.

Figure 2:
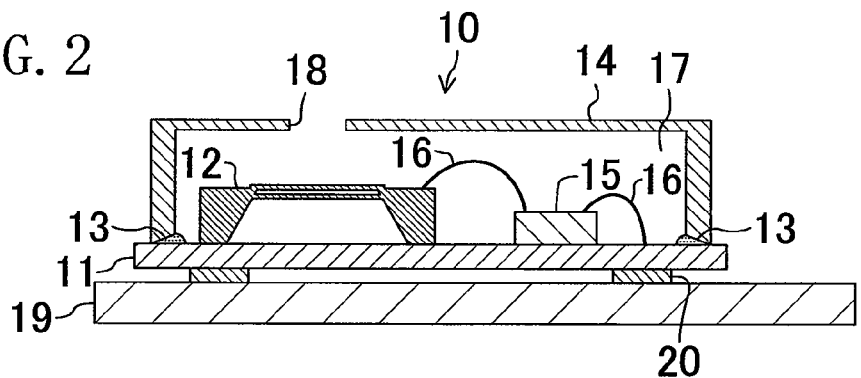
FIG. 2 is a cross-sectional view of a semiconductor package according to the first example embodiment, which is mounted on an electronic device substrate.

FIG. 2 is a cross-sectional view of a semiconductor package according to the first example embodiment, which is mounted on an electronic device substrate 19. As shown in FIG. 2, the semiconductor package 10 is mounted above the electronic device substrate 19 through a connecting member 20. As such, the semiconductor package according to the first example embodiment is mountable on an electronic device such as a mobile phone. It is apparent that the electronic device substrate 19 is electrically coupled to the semiconductor package 10.

Figure 3:
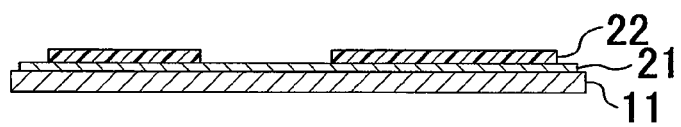
FIG. 3 is a detailed illustration of a cross-sectional view of a base material in the semiconductor package according to the first example embodiment.

FIG. 3 is a detailed illustration of a cross-sectional view of the base material 11 in the semiconductor package 10. The base material 11 is coated with metal so that a metal film 21 is formed on the first surface of the base material 11. On the metal film 21, a resist pattern 22 having a recess is formed by printing or the like to form a portion in which the metal film 21 is exposed (corresponding to the recess, on which no resist pattern is printed), and a portion in which the metal film 21 is not exposed. The cover 14, the MEMS device 12, the circuit 15, and the bonding wires 16 are bonded to the portion in which the metal film 21 is exposed. That is, bonding patterns of the cover, the MEMS device, the circuit, and the bonding wire are defined by the resist pattern 22.

Figure 4:
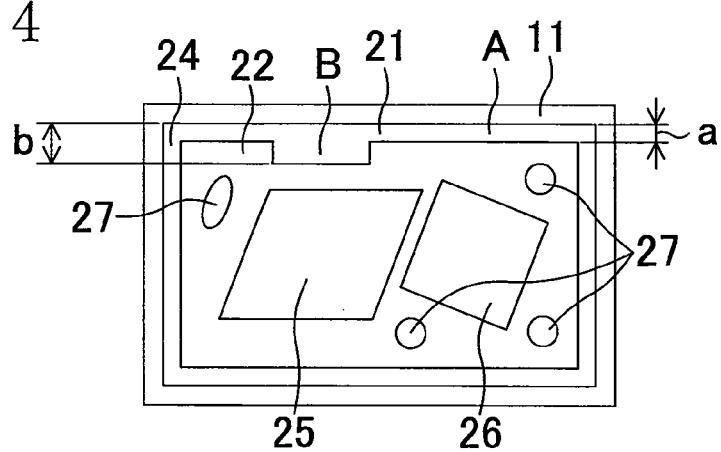
FIG. 4 is a detailed illustration of a plan view of the base material in the semiconductor package according to the first example embodiment.

FIG. 4 is a detailed illustration of a plan view of the base material 11 in the semiconductor package 10. FIG. 4 may be referred as a plan view of FIG. 3. As it is apparent from FIG. 4, the base material 11 includes portions in which the metal film 21 is exposed, and a portion in which the metal film 21 is not exposed and a resist pattern is formed. The portions in which the metal film 21 is exposed are, for example, a bonding pattern 24 of the cover which bonds the cover 14 to the base material 11, a bonding pattern 25 of the device which bonds the MEMS device 12 to the base material 11, a bonding pattern 26 of the circuit which bonds the circuit 15 to the base material 11, and bonding patterns 27 of the bonding wires which bond the bonding wires 16 to the base material 11. The bonding pattern 24 of the cover includes a region A having a substantially uniform width a, and a region B having a width b which is larger than the width a. The region B occupies from about 10% to 30% of the area of the bonding pattern 24 of the cover (the sum of the region A and the region B).

Figure 5:
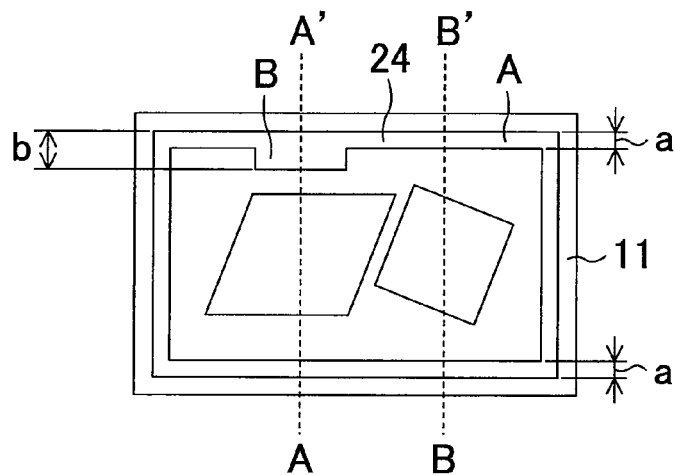
FIG. 5 is another detailed illustration of a plan view of the base material in the semiconductor package according to the first example embodiment.
Figure 6A:
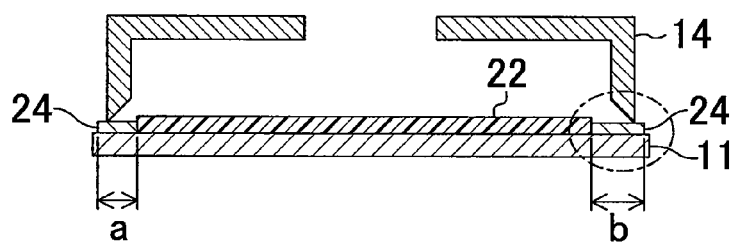
FIG. 6A is a cross-sectional view taken along the line A-A' of FIG. 5.
Figure 6B:
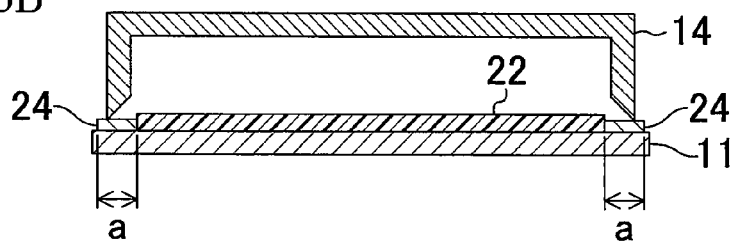
FIG. 6B is a cross-sectional view taken along the line B-B' of FIG. 5.

FIG. 5 is another detailed illustration of a plan view of the base material 11 in the semiconductor package 10. FIG. 6A is a cross-sectional view taken along the line A-A' of FIG. 5, and illustrates that the cover 14 is bonded to the bonding pattern 24 of the cover. FIG. 6B is a cross-sectional view taken along the line B-B' of FIG. 5, and illustrates that the cover 14 is bonded to the bonding pattern 24 of the cover. The illustration of the bonding material 13 is omitted. It can also be seen from FIGS. 5, 6A and 6B that the bonding pattern 24 of the cover includes the region A having a substantially uniform width a, and the region B having a width b which is larger than the width a.

One of the features of the semiconductor package according to the first example embodiment is to include the region B which is an expanded width. In this structure, a sufficient bonding area can be obtained when bonding the cover to the bonding pattern of the cover to ensure the bond strength.

Figure 13:
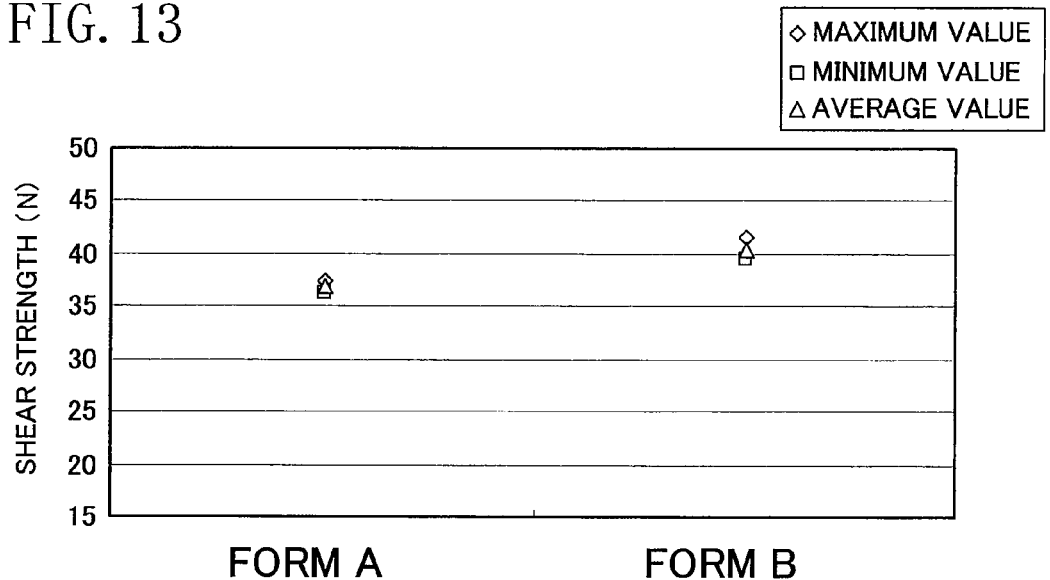
FIG. 13 is a comparison graph between bond strength between the cover and the base material in a form A in which the bonding pattern of the cover does not include an expanded region B, and that in a form B in which the bonding pattern of the cover includes an expanded region B.

FIG. 13 is a comparison graph between bond strength between the cover and the base material in a form A in which the bonding pattern of the cover does not include an expanded region B, and that in a form B in which the bonding pattern of the cover includes an expanded region B. As can be seen from FIG. 13, the form A has average bond strength of about 37 (N), while the form B has average bond strength of about 40 (N). Therefore, it is found that the bond strength between the cover and the base material is increased by about 10% where the bonding pattern of the cover includes the expanded region B, compared to the cover where the bonding pattern of the cover does not include the expanded region B.

When a bonding material made of metal is applied to the bonding pattern of the cover to bond the cover to the base material, the bonding material needs to be applied to overlap to increase sealing performance between the cover and the base material. At this time, the region B, i.e., an expanded width, is formed in advance to reliably retain an excess bonding material within the region B. This can reliably avoid the risk of an electrical short due to a contact of the excess bonding material with other metal patterns such as a bonding pattern of the MEMS device.

Furthermore, in the semiconductor package according to the first example embodiment, the area of the bonding pattern of the cover occupied by the region B preferably ranges from about 10% to 30%. In order to form the expanded region B, the metal film 21 needs to be formed sufficiently large by a plating process. Therefore, the ratio of the expanded region B preferably falls within the above-described range to prevent a cost increase due to the plating process.

Moreover, in the semiconductor package according to the first example embodiment, a width b of the region B is preferably from about 1.2 to 2 times as large as the width a of the region A. The width preferably falls within the above-described range in view of avoiding a contact of an excess bonding material with the bonding pattern of the device and the bonding pattern of the circuit, which are formed inside the bonding pattern of the cover.

Figure 14:
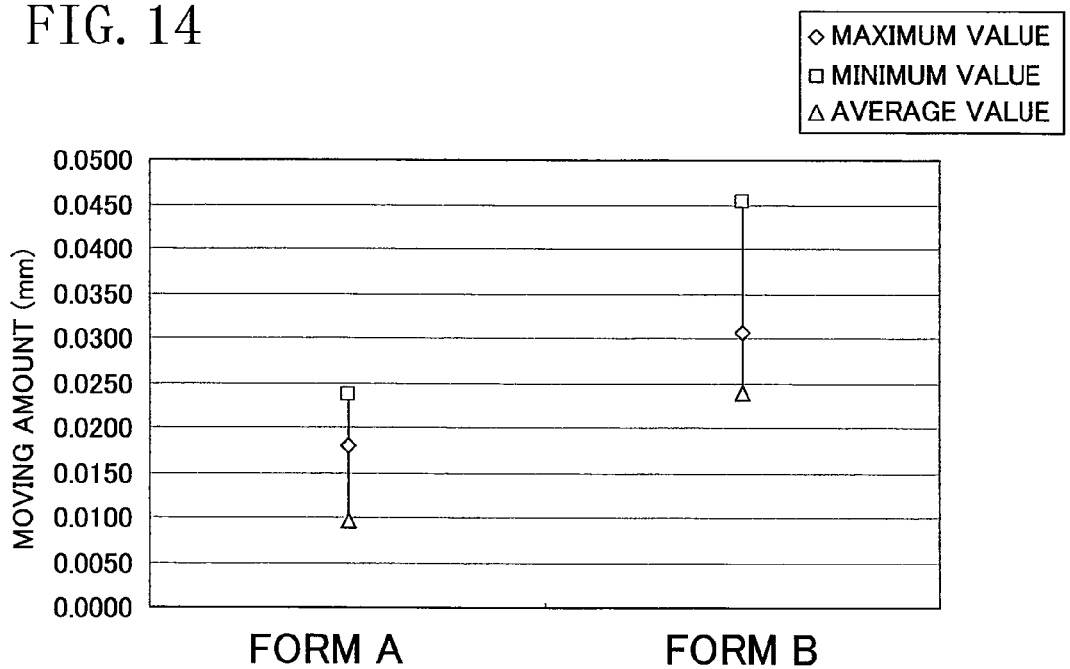
FIG. 14 is a comparison graph between a moving amount when a self-alignment effect is obtained in the form A in which the bonding pattern of the cover does not include an expanded region B, and that in the form B in which the bonding pattern of the cover includes an expanded region B.

Moreover, in the semiconductor package according to the first example embodiment, a part of the region B is preferably formed inside a side portion of the cover. In this structure, even when force causing displacement of the cover is applied, a part of the region B, which is the portion projecting from the region A, can interfere with the cover's operation to move inward. That is, a self-alignment effect is improved. FIG. 14 is a comparison graph between a moving amount when a self-alignment effect is obtained in the form A in which the bonding pattern of the cover does not include an expanded region B and that in the form B in which the bonding pattern of the cover includes an expanded region B. As can be seen from FIG. 14, the moving amount when a self-alignment effect is obtained in the form A is, on average, about 0.018 mm, while a moving amount when a self-alignment effect is obtained in the form B is, on average, about 0.031 mm. Therefore, the self-alignment effect is improved by about 70% where the bonding pattern of the cover includes the expanded region B, compared to the cover where the bonding pattern of the cover does not include the expanded region B.

In the semiconductor package according to the first example embodiment, a part of the region A is formed inside the side portion of the cover. A part of the region B is formed inside the side portion of the cover and is preferably formed inner than the part of the region A. This structure further increases the resistance to the cover's operation to move inward, even when force causing displacement of the cover is applied.

While the semiconductor package according to the first example embodiment is described using an example in which a through-hole is formed in the cover, the through-hole is preferably formed in either one of the base material and the cover. The semiconductor package functions as a microphone (MEMS microphone) where a MEMS device detects a sound wave from the through-hole, and functions as a pressure sensor where the MEMS device detects pressure from the through-hole. In these cases, the through-hole functions as an introduction hole of the sound wave or the pressure. Furthermore, where the MEMS device detects acceleration rate or angular velocity, the semiconductor package functions as an acceleration sensor or an angular velocity sensor, respectively. In this case, the through-hole functions as a passage of air in the semiconductor package. Where the capacitor functions as a pressure sensor or a microphone, the through-hole is preferably formed almost directly above or below the capacitor so that the pressure or the sound wave is transmitted directly to the capacitor.

The bonding material is preferably a conductive material, and preferably includes a metal material such as solder and/or a conductive adhesive. The cover prevents external interference, and is formed of an alloy of copper, zinc and nickel. The cover is formed to have a thickness of about 0.1 mm. As a method of applying the bonding material, a frame printing method by dispending or the like are used. As a result, the advantages of the present disclosure can be obtained more effectively, since there is a time lag between the start of application and discharge of a paste in a frame printing method. An amplifier or the like may be used as a circuit such as a CMOS.

The structure of the MEMS device in the first example embodiment will hereinafter be described using a MEMS microphone as an example.

The MEMS microphone includes an n-type silicon substrate, a vibrating membrane formed on the silicon substrate and having a first electrode, a stationary membrane formed above the vibrating membrane with an air gap interposed therebetween and having a second electrode, and a support membrane for supporting the stationary membrane. A silicon substrate through-hole is formed in the silicon substrate. A plurality of sound holes are formed in the stationary membrane. The air gap is formed by removing a part of the support membrane by etching with the use of the sound holes. The MEMS microphone detects, to function as a microphone, a capacitance variation between the first electrode and the second electrode caused by vibration of the vibrating membrane formed on the silicon substrate through-hole due to a sound wave, which passes through the sound holes formed in the stationary membrane. Note that the first electrode and the second electrode function as a pair of capacitors.

Figure 15A:
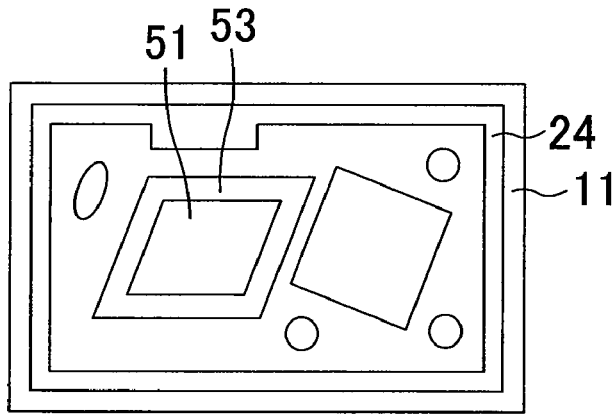
FIGS. 15A-15C are illustrations of a bonding pattern of the MEMS device.
Figure 15B:
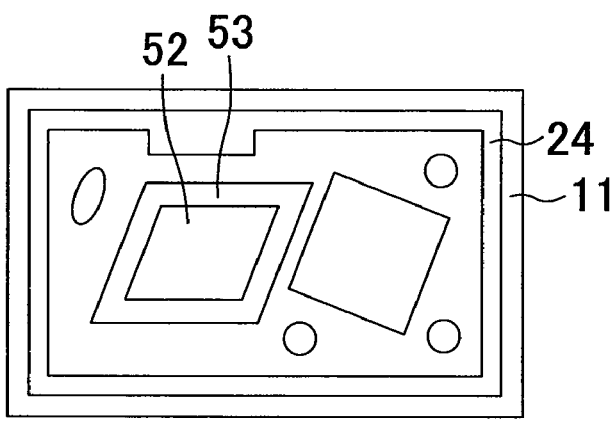
Figure 15C:
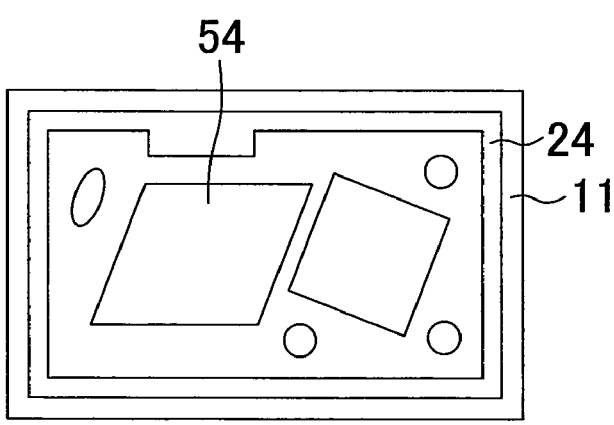
Figure 16A:
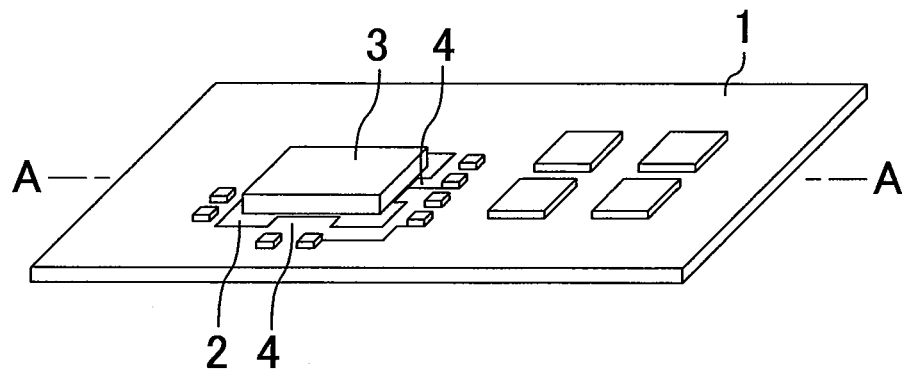
FIGS. 16A and 16B are illustrations of prior art.
Figure 16B:
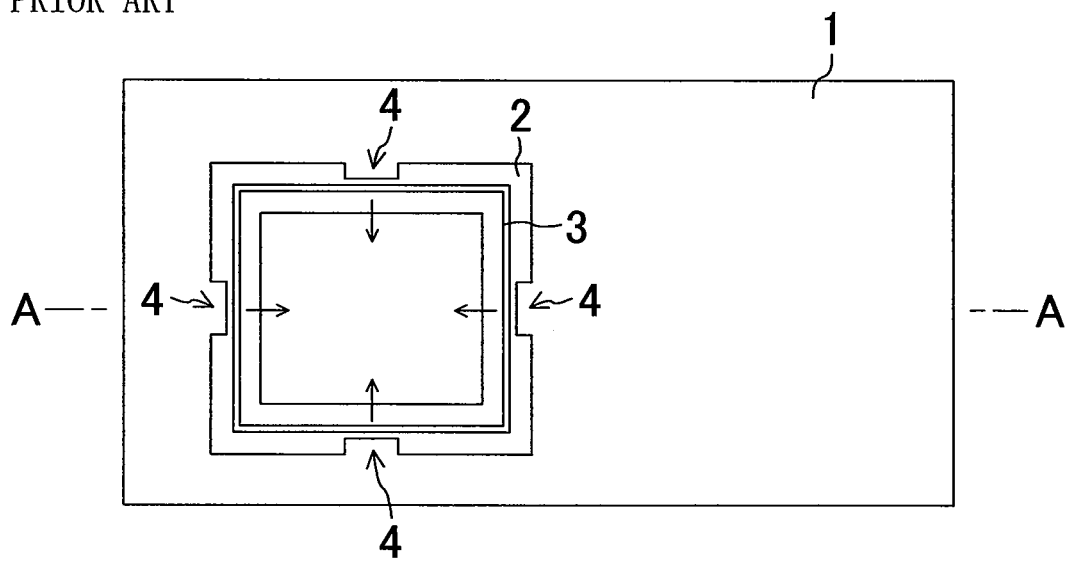

Next, the bonding pattern of the MEMS device in the first example embodiment is briefly described with reference to FIGS. 15A-15C. FIGS. 15A-15C are illustrations of the bonding pattern of the MEMS device.

FIG. 15A illustrates that a metal film is not formed on a central portion 51 of the bonding pattern of the MEMS device, and formed only on a peripheral edge 53 of the bonding pattern of the MEMS device. While the drawing used in the first example embodiment and the modifications shows that the metal film is formed in the central portion 51 of the bonding pattern of the MEMS device, the metal film may not be formed in the central portion 51 of the bonding pattern of the MEMS device. This is because the silicon substrate through-hole for vibrating the vibrating membrane is formed in the silicon substrate of the MEMS device. The silicon substrate remains at the peripheral edge of the silicon substrate through-hole, and thus, only the remaining portion needs to be bonded to the base material. Therefore, usually, the metal film may not be formed in the central portion 51 of the bonding pattern of the MEMS device. No resist needs to be formed in the central portion 51 of the bonding pattern of the MEMS device, as well.

However, as shown in FIG. 15B, a metal film 52 is formed on the central portion 51 of the bonding pattern of the MEMS device. As shown in FIG. 15C, the metal film 54 is preferably formed on the entire bonding pattern of the MEMS device. The reasons are provided below.

First, in order to bond a MEMS device to a base material, a thermosetting epoxy adhesive needs to be applied to the peripheral edge of the bonding pattern of the MEMS device. A metal film is formed to the central portion of the bonding pattern of the MEMS device, thereby increasing an area, to which an adhesive can be applied, to retain the increased amount of the adhesive. This enables an increase in the bond strength between the MEMS device and the base material. To be specific, the shear strength can be increased from about 8 N to about 9.5 N, by about 20%. The shear strength here refers to the strength from a direction parallel to the base material.

Furthermore, the adhesive can be prevented from leaking into other coating patterns. To be specific, the limit amount of the applied adhesive which does not leak can be increased from about 50 μg to about 60 μg, by about 20%.

When applying an adhesive to overlap, a margin of overcoating is improved. This provides advantages when the plan view of the silicon substrate of the MEMS device is in an almost rhombus shape. When the plan view has an almost rhombus shape, the bonding pattern of the MEMS device needs to be in an almost rhombus shape, as well. This is because a corner of the rhombus shape, which has a greater angle, is set to be the starting point and the ending point of bonding, thereby effectively absorbing the amount of the adhesive increased by overcoating.

First Modification of First Example Embodiment

Figure 7A:
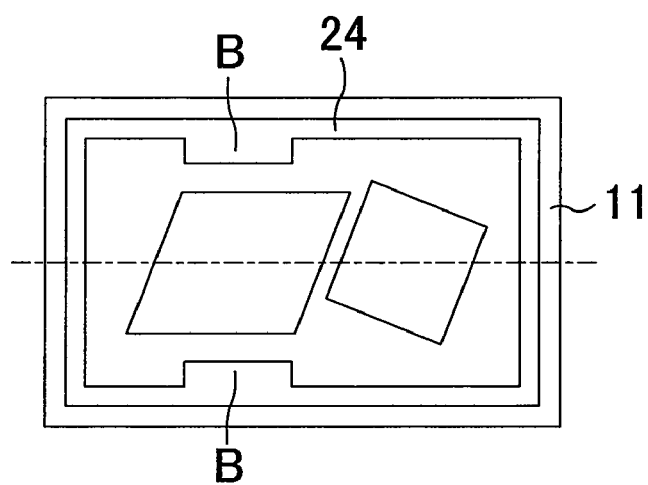
FIGS. 7A and 7B illustrate a first modification of a bonding pattern of a cover of the semiconductor package according to the first example embodiment.
Figure 7B:
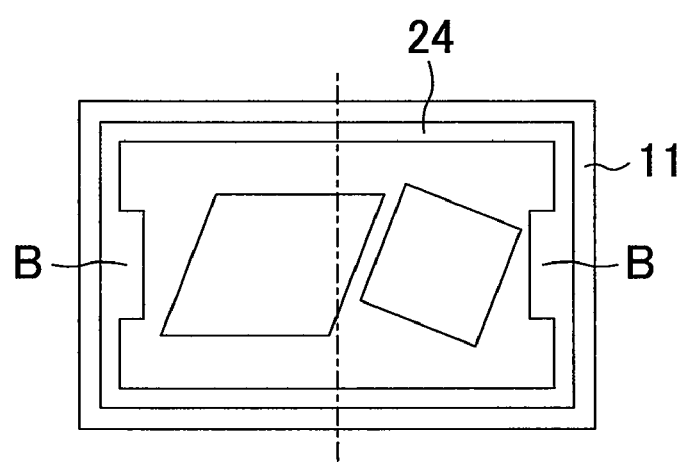

FIGS. 7A and 7B illustrate a first modification of the bonding pattern of the cover. As shown in FIGS. 7A and 7B, regions B may be formed in two portions. By forming the regions B in two portions, the above-described bond strength and the effect to prevent an electrical short can be increased. Furthermore, if the effect of a positioning correction obtained when thermally curing the bonding material is reduced, a self-alignment effect occurring in a reflow process can be obtained more sufficiently by providing a plurality of expanded portions. At this time, a pair of regions B is preferably positioned almost symmetrically with respect to the perpendicular bisector of each side of the base material 11. When the expanded portions are formed symmetrically, a self-alignment effect occurring in a reflow process can be obtained more effectively.

Second Modification of First Example Embodiment

Figure 8A:
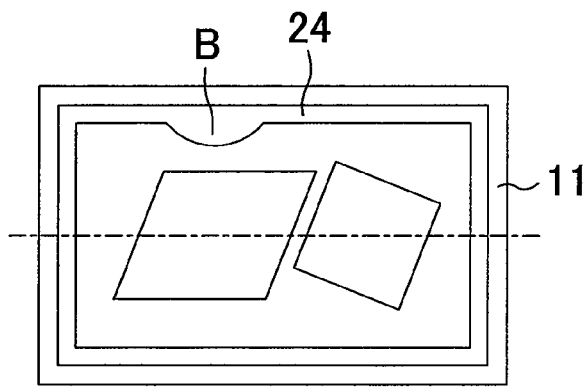
FIGS. 8A-8C illustrate a second modification of the bonding pattern of the cover of the semiconductor package according to the first example embodiment.
Figure 8B:
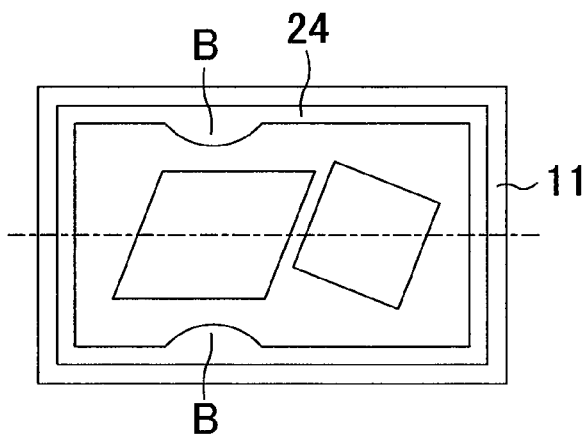
Figure 8C:
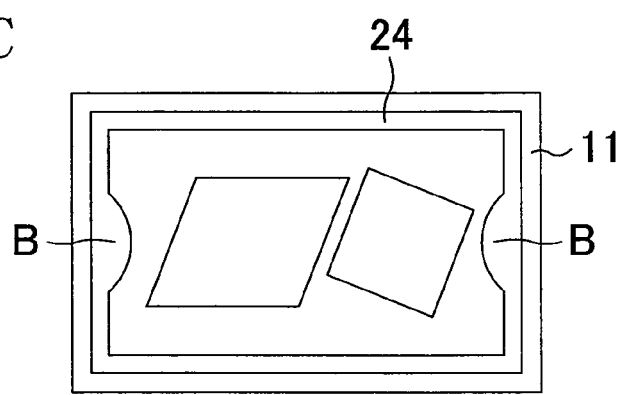

FIGS. 8A-8C illustrate a second modification of the bonding pattern of the cover. As shown in FIGS. 8A-8C, an expanded region B, which is not in a rectangular shape, may be formed. As shown in FIGS. 8A-8C, the expanded portion may not be in a rectangular shape, but may be in an oval shape. By forming the expanded portion in an oval shape, a design can be modified as appropriate so that a MEMS device pattern or an amplifier pattern hardly comes into contact with an excess boding material. Furthermore, the expanded portion may be in a square shape. By forming a plurality of expanded portions, similar advantages to the first modification of the first example embodiment can be expected.

Third Modification of First Example Embodiment

Figure 9:
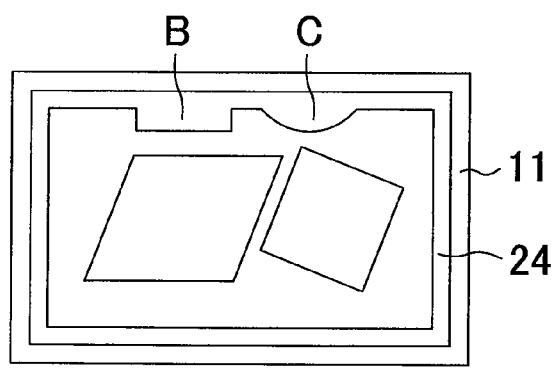
FIG. 9 illustrates a third modification of the bonding pattern of the cover of the semiconductor package according to the first example embodiment.

FIG. 9 illustrates a third modification of the bonding pattern of the cover. As shown in FIG. 9, both of the expanded region B having a rectangular shape and the expanded portion C having an oval shape may be formed. By forming a plurality of expanded portions, similar advantages to the first and second modifications of the first example embodiment can be expected.

Fourth Modification of First Example Embodiment

Figure 10A:
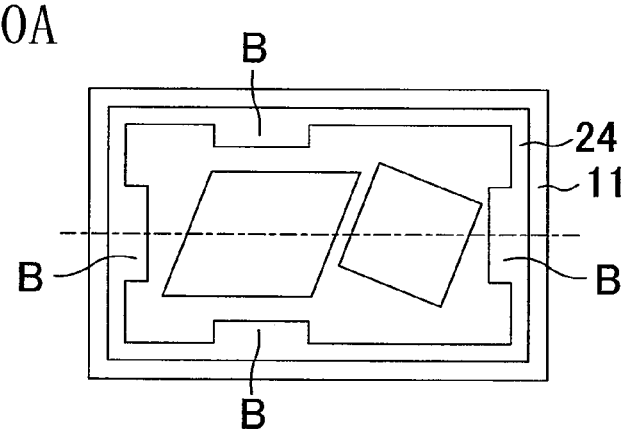
FIGS. 10A and 10B illustrate a fourth modification of the bonding pattern of the cover of the semiconductor package according to the first example embodiment.
Figure 10B:
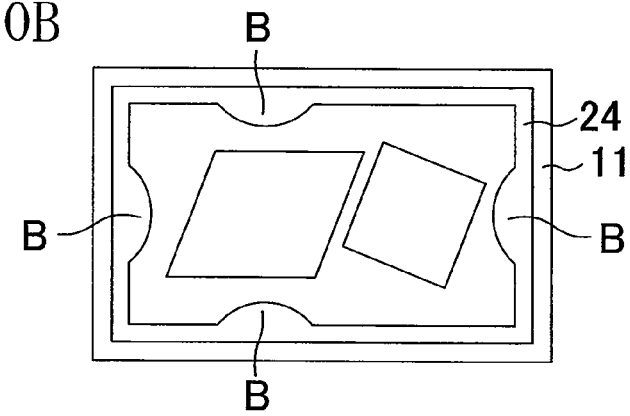

FIGS. 10A and 10B illustrate a fourth modification of the bonding pattern of the cover. As shown in FIGS. 10A and 10B, the number of the expanded region B may be two or more. By forming a plurality of expanded portions, similar advantages to the first to third modifications of the first example embodiment can be expected.

Fifth Modification of First Example Embodiment

Figure 11A:
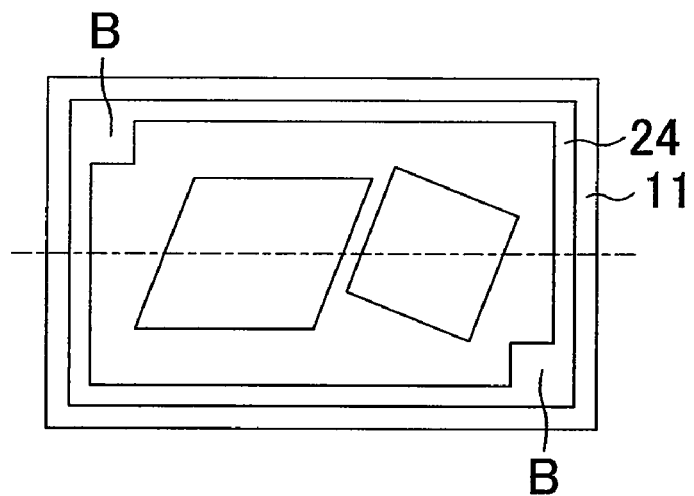
FIGS. 11A and 11B illustrate a fifth modification of the bonding pattern of the cover of the semiconductor package according to the first example embodiment.
Figure 11B:
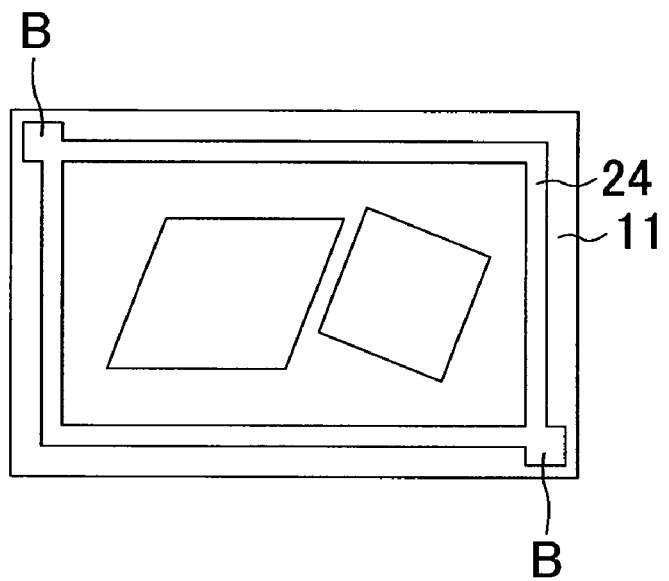

FIGS. 11A and 11B illustrate a fifth modification of the bonding pattern of the cover. As shown in FIGS. 11A and 11B, expanded regions B may be positioned line-symmetrically with respect to the base material. When there is no problem with the layout as shown in FIG. 11B, the expanded portion may be formed outside the bonding pattern of the cover. However, the expanded portion is preferably formed inside to minimize the entire size of the semiconductor package. By forming a plurality of expanded portions, similar advantages to the first to fourth modifications of the first example embodiment can be expected.

Second Example Embodiment

A second example embodiment will hereinafter be described in detail with reference to FIGS. 12A-12E. The materials and numerical values used in the present disclosure are merely preferable examples, and the scope of the present invention is not limited to this embodiment. The present embodiment can be practiced with modification and alteration within the spirit and scope of the present disclosure. In addition, the present embodiment can be implemented in combination with any other embodiment. In particular, the present embodiment provides advantages more effectively in combination with the first example embodiment and the modifications. FIGS. 12A-12E illustrate the bonding portion of the cover and the base material.

Figure 12A:
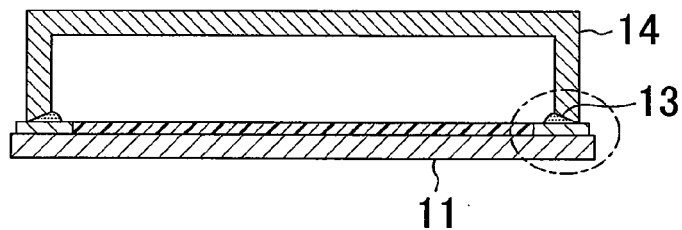
FIGS. 12A-12E are illustrations of a bonding portion of a cover and the base material.

FIG. 12A illustrates a part of a semiconductor package according to the second example embodiment. The description of FIG. 12A is omitted to avoid repetition of the descriptions of FIGS. 1 and 3. FIGS. 12B-12E are enlarged views of the bonding region A shown in FIG. 12A. FIGS. 12B-12E will be described in detail below.

Figure 12B:
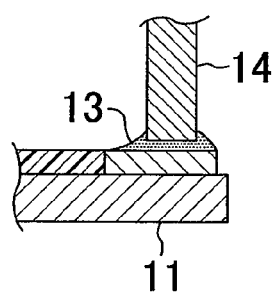

FIG. 12B illustrates an example in which the cover is in contact with the bonding pattern of the cover through the bonding material, and the contact surface of the cover is parallel to the contact surface of the bonding pattern with the cover.

Figure 12C:
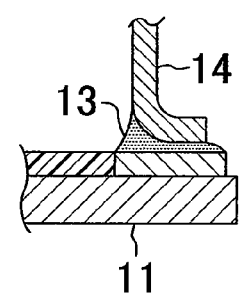

FIG. 12C illustrates an example in which the side portion of the cover bends toward the outside of the base material, near the bonding portion of the base material and the cover. As such, the side portion is bended near the bonding portion to provide a bonding area larger than the thickness of the side portion of the cover. This increases the bond strength of the cover. The width of the bonding portion is preferably about twice the thickness of the side portion of the cover. To be specific, the length of the bended portion is about 0.2 mm on each side near the bonding portion. This doubles the bonding area of the cover which is configured to have a side portion having a thickness of 0.1 mm.

Figure 12D:
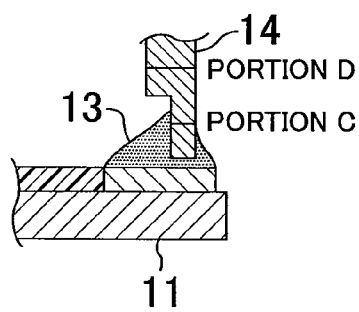

FIG. 12D illustrates an example in which the side portion of the cover has two types of thickness near the bonding portion of the base material and the cover. To be specific, a portion D has a uniform width, and a tip portion C of the bonding portion has a thickness half of the thickness of the portion D. In other words, the cover has a tapered shape near the bonding area of the cover. This tapered shape enables bonding of the cover to a further narrowed bonding pattern of the cover.

Figure 12E:
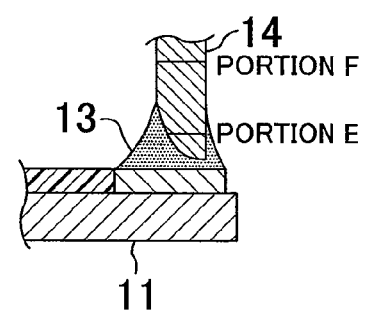

FIG. 12E illustrates an example in which the side portion of the cover is rounded so that the tip portion of the side portion has a thickness gradually decreasing toward the surface of the bonding pattern, near the bonding portion of the base material and the cover. To be specific, a portion F has a uniform width, and a tip portion E of the bonding portion is rounded to about a 0.05 mm radius with respect to the portion F. The rounding is performed inside the cover. As such, rounding of the side portion of the cover enables bonding of the cover to a further narrowed bonding pattern of the cover and an increase in the bond strength.

In the first and second example embodiments, the MEMS technology here refers to a technology of manufacturing devices such as capacitor microphones and capacitance type pressure sensors by dividing substrates (i.e., wafers) in which a plurality of chips are formed at one time, using a manufacturing process technology of complementary metal-oxide semiconductors (CMOSs) and the like. The MEMS device here refers to a device formed by such a MEMS technology.

As described above, a semiconductor package according to the present disclosure which is mountable on an electronic device substrate is very useful, since bond strength between a base material and a cover which constitute a semiconductor package is increased by the use of the semiconductor package, even when the entire size of the package is minimized.

What is claimed is:

1. A semiconductor package comprising:
   a base material;
   a capacitor formed on the base material; and
   a cover formed over the base material to cover the capacitor, and having a side portion and an upper portion, wherein
   the base material is provided with a bonding pattern connecting the base material and the cover to cover the capacitor, and
   the bonding pattern, which connects the base material and the cover, includes a region A having a substantially uniform pattern width A, and at least one region B having a pattern width B which is larger than the width pattern width A.

2. The semiconductor package of claim 1, wherein the region B occupies from 10% to 30% of the bonding pattern of the cover.

3. The semiconductor package of claim 1, wherein the bonding pattern is made of metal.

4. The semiconductor package of claim 1, wherein the bonding pattern is formed on the base material by resist patterning.

5. The semiconductor package of claim 1, wherein a part of the region B is formed inside the side portion of the cover.

6. The semiconductor package of claim 1, wherein
a part of the region A is formed inside the side portion of the cover,
a part of the region B is formed inside the side portion of the cover, and
the part of the region B is formed inner than the part of the region A.

7. The semiconductor package of claim 1, wherein multiple ones of the at least one region B are formed in two portions.

8. The semiconductor package of claim 7, wherein the regions B formed in two portions are positioned point-symmetrically with respect to the base material.

9. The semiconductor package of claim 1, wherein the region B is positioned inside and adjacent to the bonding pattern of the base material.

10. The semiconductor package of claim 1, wherein the pattern width B is from 1.2 to 2 times as large as the pattern width A.

11. The semiconductor package of claim 1, wherein the capacitor is a semiconductor device.

12. The semiconductor package of claim 1, wherein the capacitor is a MEMS microphone.

13. The semiconductor package of claim 1, wherein a through-hole is formed in either one of the base material and the cover.

14. The semiconductor package of claim 1, wherein a surface of the cover which is in contact with the bonding pattern is formed to be parallel to a surface of the bonding pattern which is in contact with the cover.

15. The semiconductor package of claim 1, wherein the side portion of the cover bends toward the outside of the base material near the bonding portion of the base material and the cover.

16. The semiconductor package of claim 1, wherein
the side portion of the cover is constituted by a portion C which is near the bonding portion of the base material and the cover, and a portion D other than the portion C, and
the portion C has a smaller width than the portion D.

17. The semiconductor package of claim 1, wherein
the side portion of the cover is constituted by a portion E which is near the bonding portion of the base material and the cover, and a portion F other than the portion E, and
a width of the portion E decreases gradually toward the bonding portion compared to the portion F.

18. The semiconductor package of claim 1, wherein the cover is bonded to the base material using a conductive bonding material.

* * * * *